(12) United States Patent
Ebefors et al.

(10) Patent No.: US 9,613,863 B2
(45) Date of Patent: Apr. 4, 2017

(54) METHOD FOR FORMING ELECTROLESS METAL THROUGH VIA

(71) Applicant: SILEX MICROSYSTEMS AB, Jarfalla (SE)

(72) Inventors: Thorbjorn Ebefors, Huddinge (SE); Henrik Knutsson, Vastervik (SE)

(73) Assignee: SILEX MICROSYSTEMS AB, Jarfalla (SE)

( * ) Notice: Subject to any disclaimer, the term of this patent is extended or adjusted under 35 U.S.C. 154(b) by 0 days.

(21) Appl. No.: 15/040,148

(22) Filed: Feb. 10, 2016

(65) Prior Publication Data
US 2016/0172241 A1 Jun. 16, 2016

Related U.S. Application Data

(62) Division of application No. 14/431,002, filed as application No. PCT/SE2013/051124 on Sep. 27, 2013, now Pat. No. 9,514,985.

(30) Foreign Application Priority Data

Sep. 27, 2012 (SE) ...................................... 1251089

(51) Int. Cl.
*H01L 21/44* (2006.01)
*H01L 21/768* (2006.01)
(Continued)

(52) U.S. Cl.
CPC .... *H01L 21/76897* (2013.01); *H01L 21/0217* (2013.01); *H01L 21/02381* (2013.01);
(Continued)

(58) Field of Classification Search
CPC ............... H01L 21/44; H01L 21/76897; H01L 21/76879; H01L 21/76874; H01L 23/481; H01L 23/5384
See application file for complete search history.

(56) References Cited

U.S. PATENT DOCUMENTS 5,969,393 A * 10/1999 Noguchi ........... H01L 21/76224
257/396
6,180,523 B1  1/2001 Lee et al.
(Continued)

FOREIGN PATENT DOCUMENTS

WO  2007089206  8/2007

OTHER PUBLICATIONS

F. Inoue et al. "Study of Low Resistance TSV Using Electroless Plated Copper and Tungsten-alloy Barrier", Department of Mechanical Engineering, Kansai University, 3-3-35 Yamate-cho, Suita, Osaka, Japan; IEEE International, Date of Conference: Jun. 1-3, 2009; pp. 167-168.

(Continued)

*Primary Examiner* — Phuc Dang
(74) *Attorney, Agent, or Firm* — Young & Thompson

(57) ABSTRACT

A method of making a substrate-through metal via having a high aspect ratio, in a semiconductor substrate, and a metal pattern on the substrate surface, includes providing a semiconductor substrate (wafer) and depositing poly-silicon on the substrate. The poly-silicon on the substrate surface is patterned by etching away unwanted portions. Then, Ni is selectively deposited on the poly-silicon by an electroless process. A via hole is made through the substrate, wherein the walls in the hole is subjected to the same processing as above. Cu is deposited on the Ni by a plating process. Line widths and spacings <10 μm are provided on both sides of the wafer.

20 Claims, 14 Drawing Sheets

(51) Int. Cl.
*H01L 21/288* (2006.01)
*H01L 23/48* (2006.01)
*H01L 21/02* (2006.01)

(52) U.S. Cl.
CPC .. *H01L 21/02532* (2013.01); *H01L 21/02595* (2013.01); *H01L 21/288* (2013.01); *H01L 21/76847* (2013.01); *H01L 21/76874* (2013.01); *H01L 21/76879* (2013.01); *H01L 21/76888* (2013.01); *H01L 21/76892* (2013.01); *H01L 21/76898* (2013.01); *H01L 23/481* (2013.01); *H01L 2924/0002* (2013.01)

(56) References Cited

U.S. PATENT DOCUMENTS

| | | | |
|---|---|---|---|
| 2004/0203224 A1 | 10/2004 | Halahan et al. | |
| 2006/0144618 A1* | 7/2006 | Song | H05K 3/423 174/266 |
| 2007/0048994 A1* | 3/2007 | Tuttle | H01L 21/76898 438/597 |
| 2011/0057317 A1* | 3/2011 | Koike | H01L 21/28518 257/751 |
| 2012/0068343 A1* | 3/2012 | Honda | H01L 21/28518 257/751 |
| 2012/0142185 A1* | 6/2012 | Park | H01L 21/76898 438/667 |
| 2012/0153477 A1 | 6/2012 | Shen | |

OTHER PUBLICATIONS

International Search Report PCT/SE2013/051124 dated Mar. 25, 2014.

\* cited by examiner

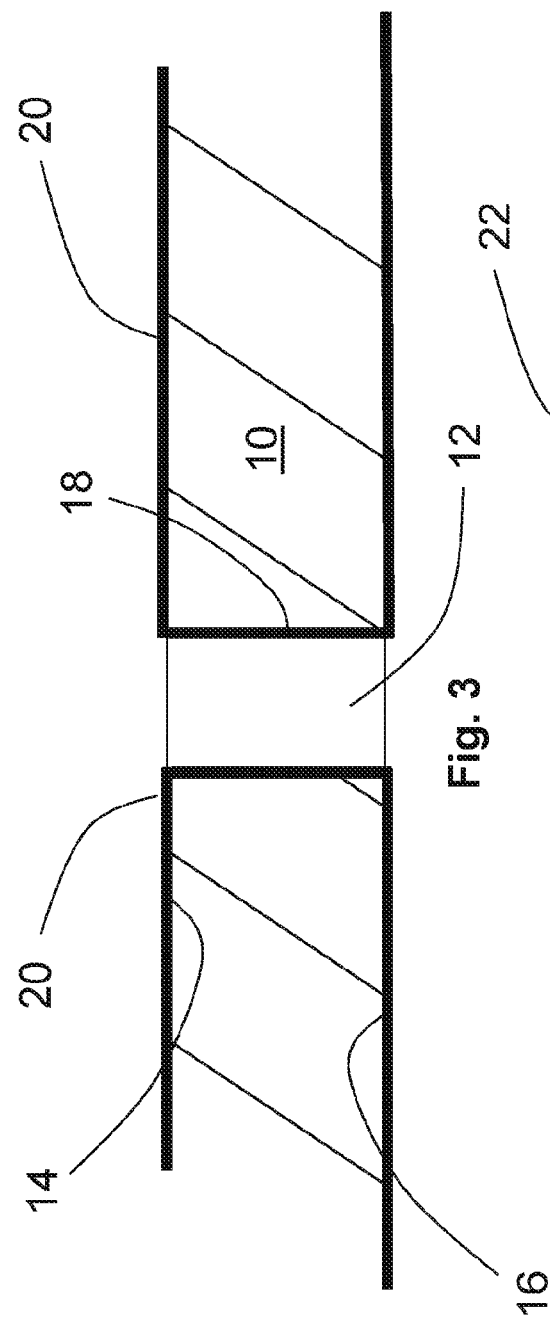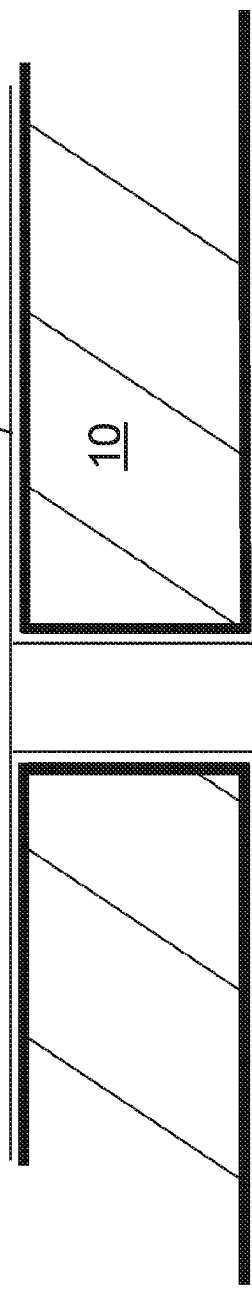

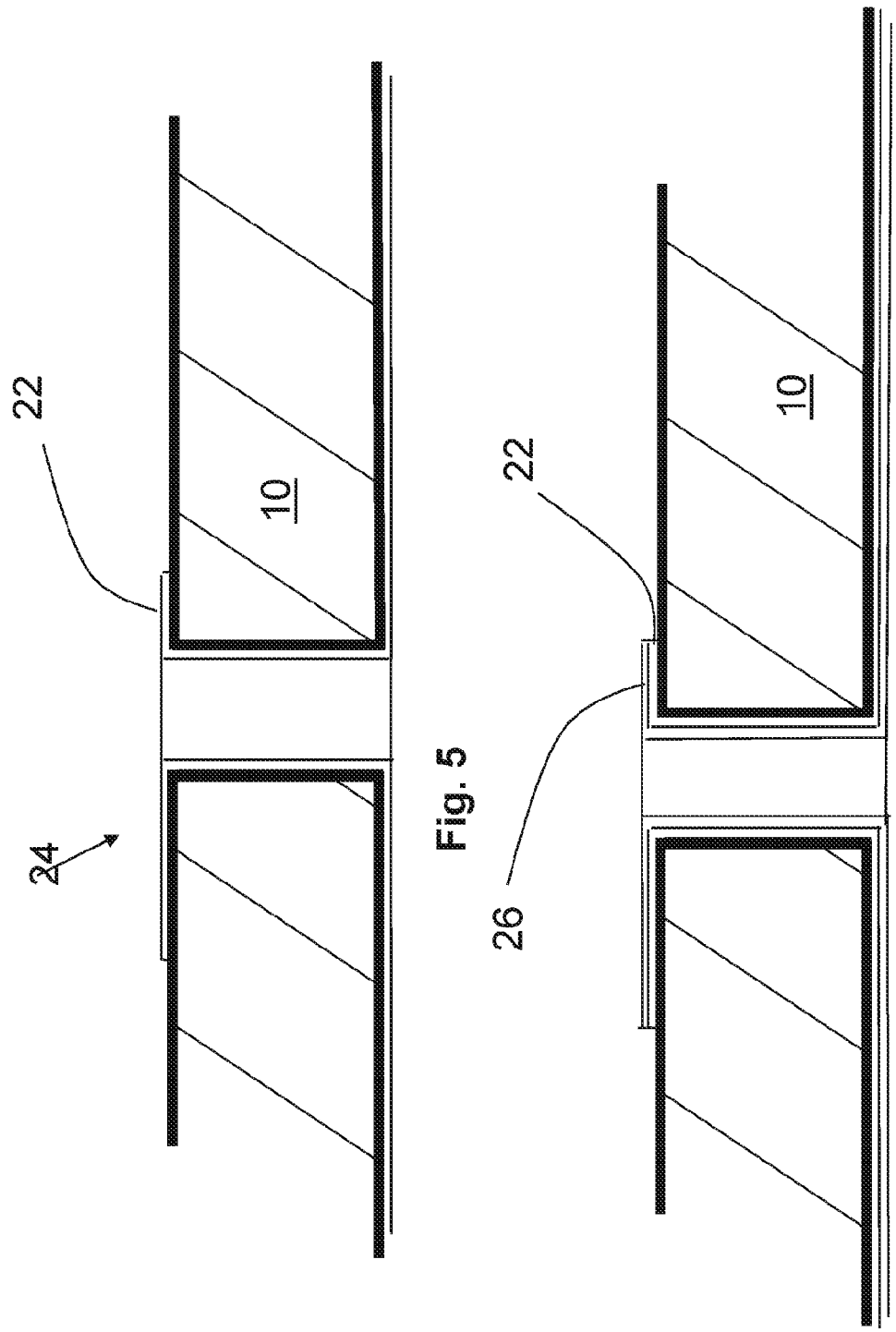

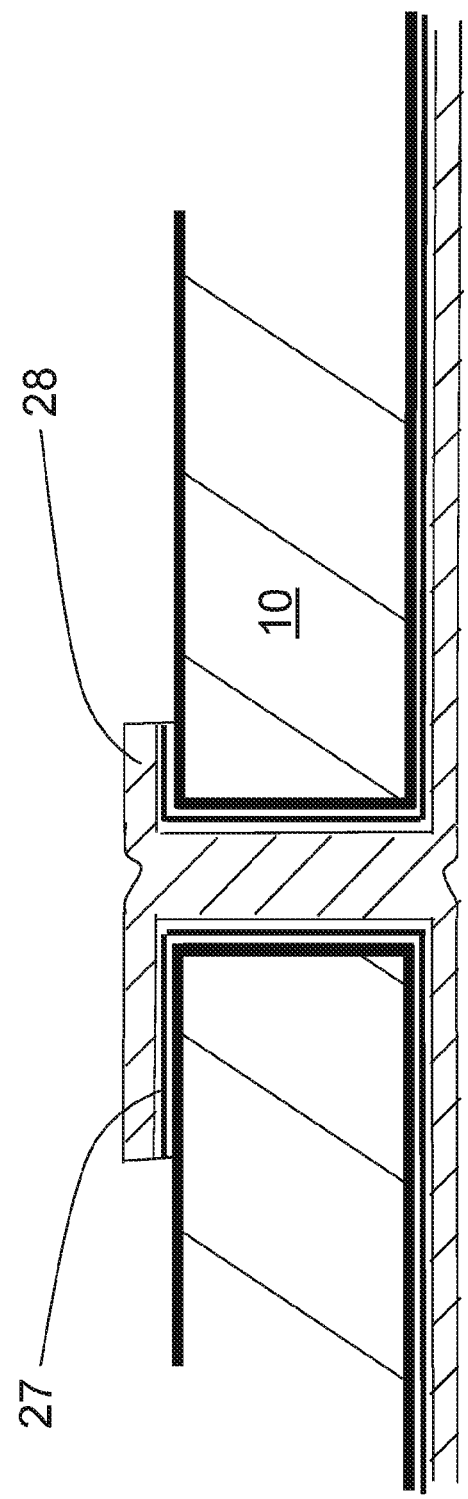

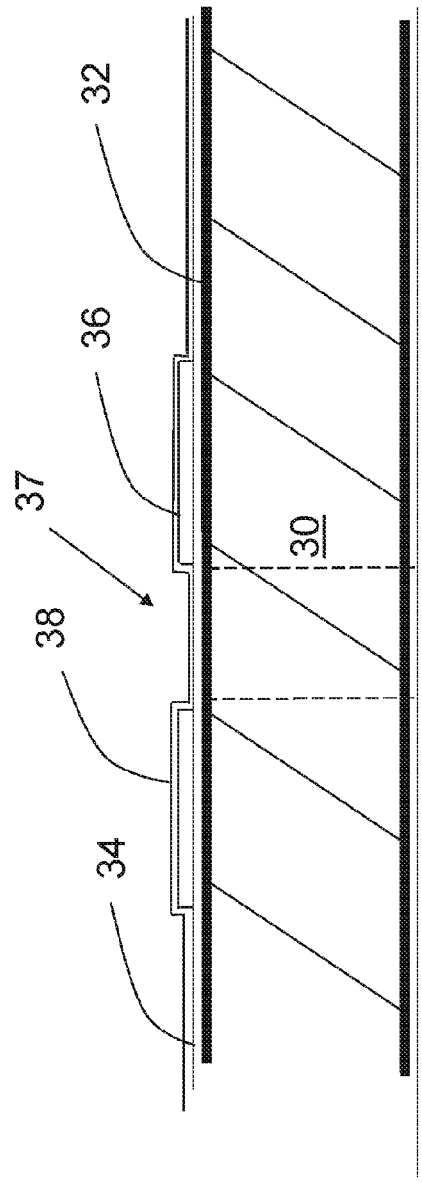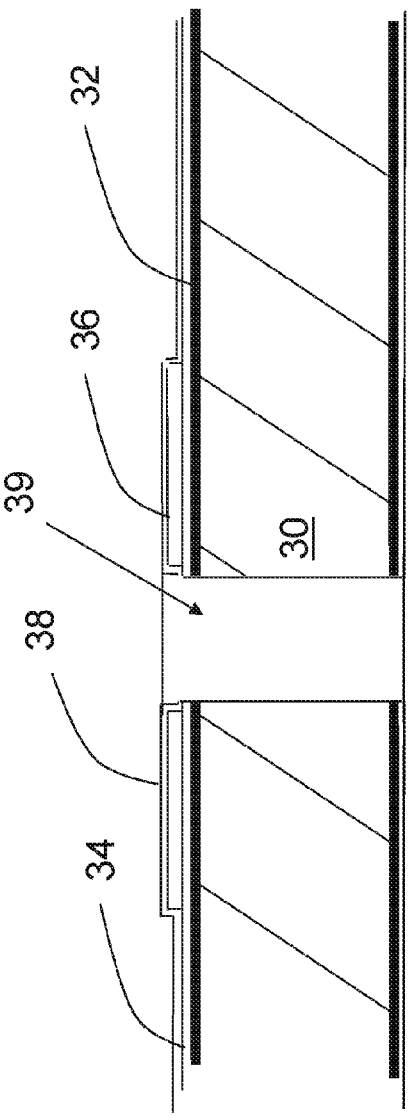

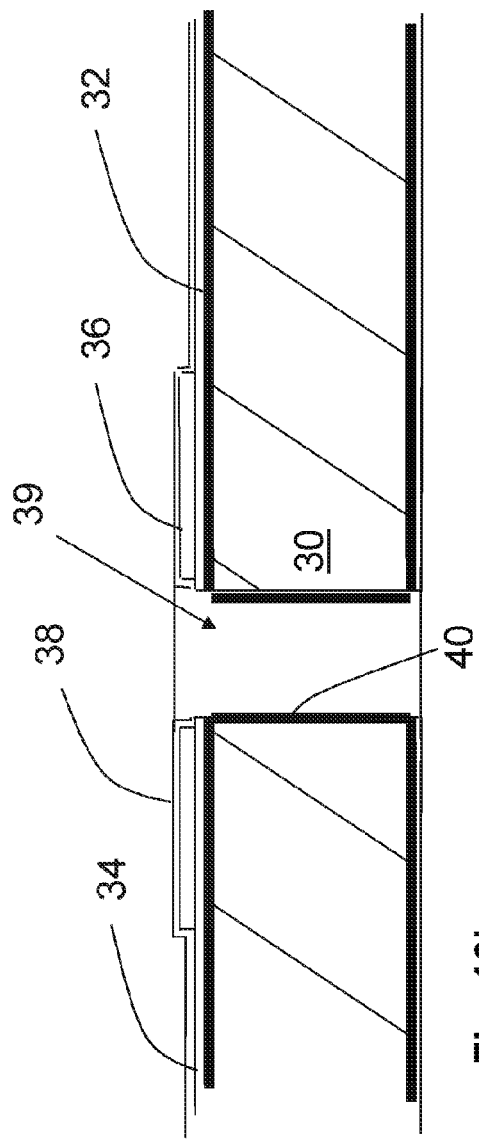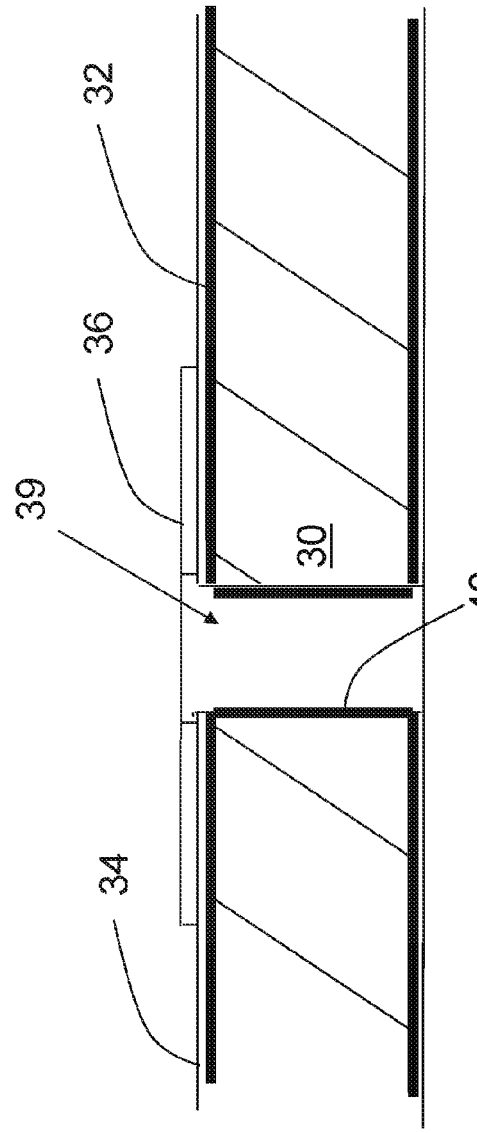

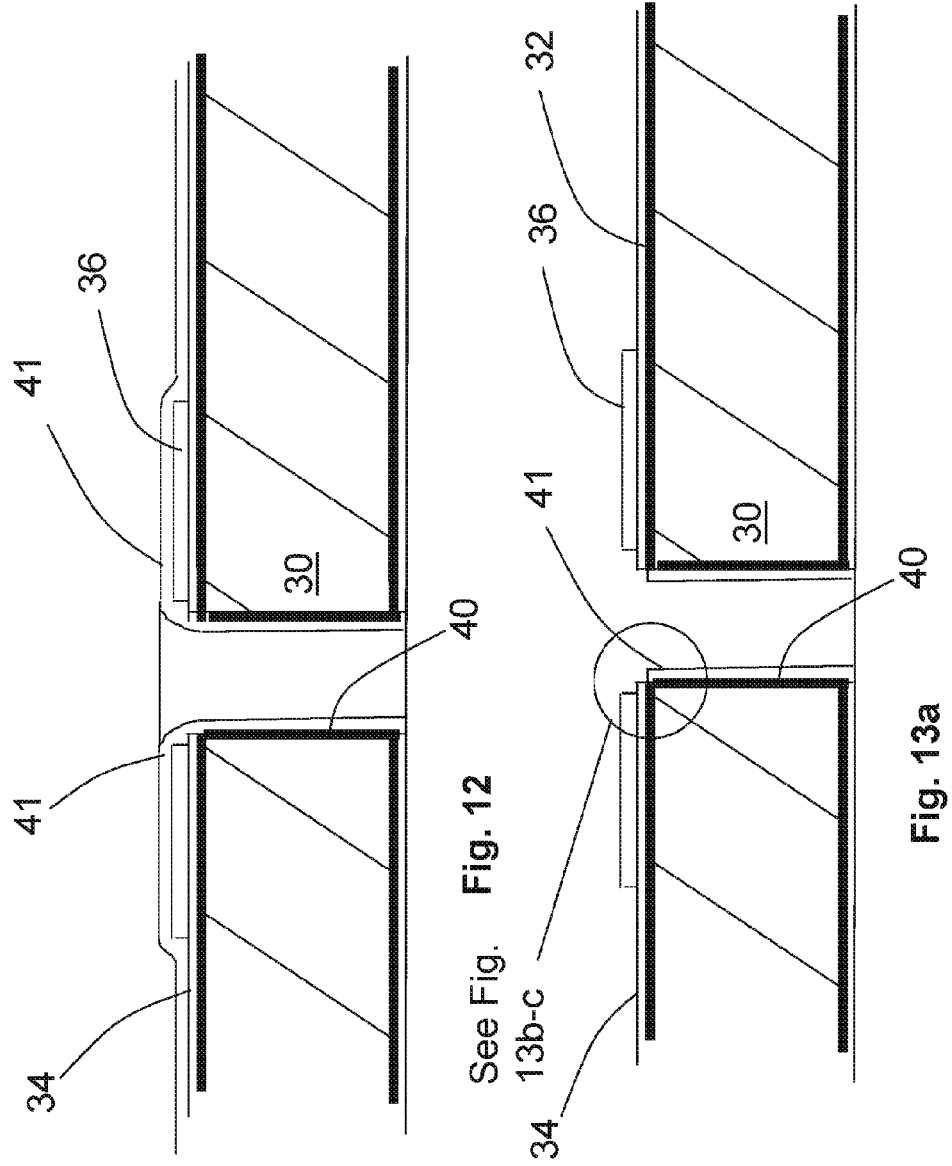

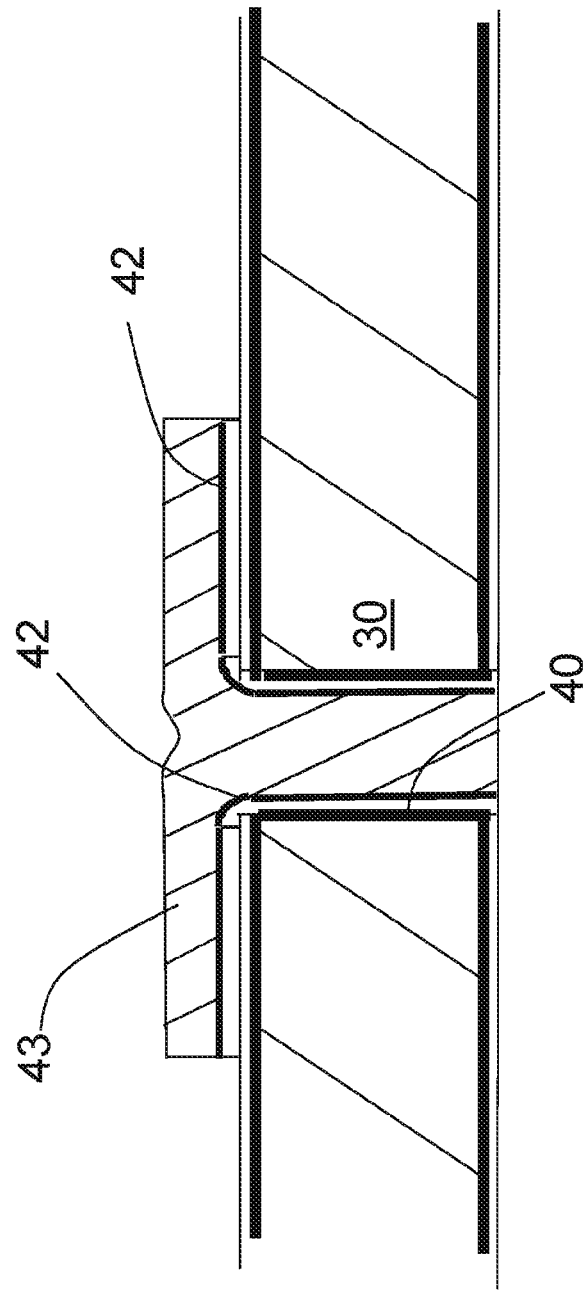

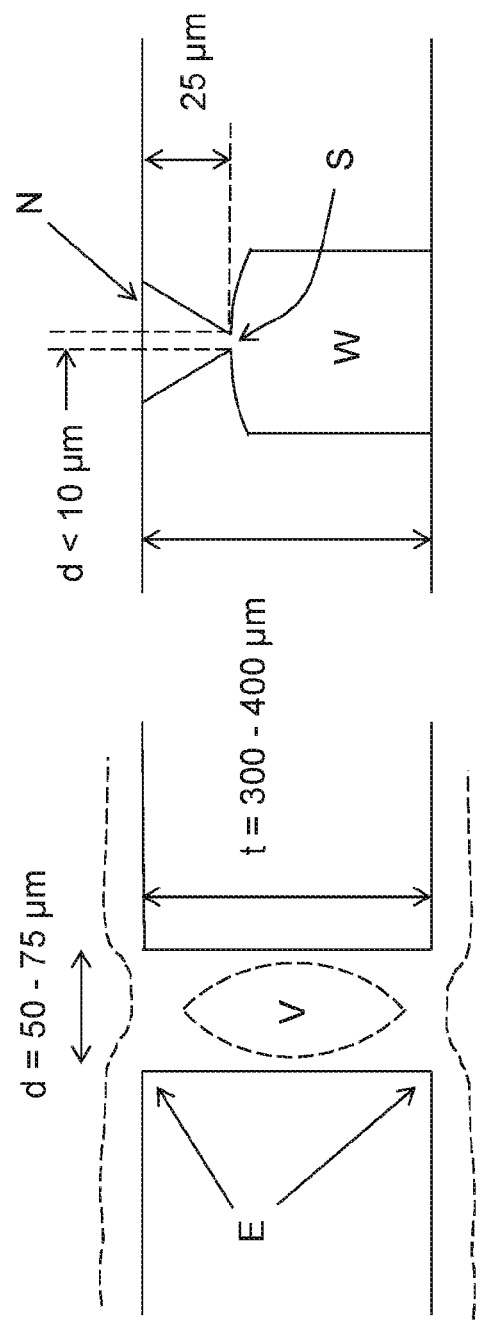

with today available technologies it provides line widths >10 µm, at least in cost effective volume production.

METHOD FOR FORMING ELECTROLESS METAL THROUGH VIA

FIELD OF THE INVENTION

This invention is related to through silicon via (TSV) technology, and in particular to providing metal vias with high aspect ratio in substrates together with self-aligned routing structures on the surface of the substrate, in order to make so called interposers.

BACKGROUND OF THE INVENTION

In the strive for making components smaller and smaller in particular for stacking of dies in three dimensions, also the so called through-substrate vias (or through-silicon vias specifically), which are used for routing signals from one side of a substrate to another, are required to be smaller and more densely packed. This will have as a consequence that aspect ratios will be higher, i.e. the ratio between depth and width D/W>5.

The sputtering techniques commonly used for providing metal vias are not feasible for aspect ratios of this magnitude, since they result in non-conformal deposition which in turn causes problems in achieving appropriate "step coverage" on the walls. Technologies that provide better step coverage such as ALD, (MO)CVD and others are expensive, slow and cannot be used for batch processing. The above negative effects are what cause the problems with obtaining appropriate adhesion of barrier and seed layers for plating. Also these technologies most often requires one-sided processing of wafers resulting in a need for complex carrier wafer solutions if the wafers comprise open wafer-through holes.

For high aspect ratio blind via holes there is also a problem when electrodeposition is used in that it is difficult to provide appropriate wetting of the holes and therefore it is difficult to bring the chemistry down into the holes in an appropriate manner.

Also, it is desirable to provide area effective and narrow electrical lead patterns (or routings) on the substrate surface for routing signals to and from components on the substrate through the substrate using the vias. Such routing patterns can be fairly complicated to process and often requires several lithographic steps, and/or CMP (Chemical Mechanical Polishing) which is an expensive procedure. Wet etching of seed layer and barrier layer is quite often complex, if it has to be performed after the Cu electroplating. See e.g. an article by Richard et al, "Barrier and Copper Seed Layer Wet Etching" in Solid State Phenomena, Vol. 103-104, 2005, pp 361-364.

In EP 1 987 535 (Silex) there is disclosed a method of making metal vias using gold. In view of gold being a very expensive material this method is not particularly economically feasible.

Alchimer in WO 2010/133550 discloses a method of making a coated substrate, wherein a cavity is made in a substrate surface by etching. An insulating dielectric layer is deposited on the substrate surface, and then polysilicon, which is in situ doped with phosphorous, is deposited on the dielectric layer. Finally, copper is electrodeposited on the doped polysilicon. No Cu diffusion barrier is provided in this process.

In applicants own WO 2010/059188 A1 simultaneous "self-alignment" of routing and via filling is achieved, but

SUMMARY OF THE INVENTION

The object of the invention is to provide a method that overcomes the drawbacks indicated in the background, and enables the provision of conformal metal coatings with good adhesion in combination with Cu diffusion barrier layer, in high aspect ratio via holes, and in the same process provides self-aligned routing patterns with fewer steps than according to the prior art methods. This is achieved by a method based on electroless plating using open via holes, and is defined in claim 1.

In a first embodiment the method provides "self alignment" of metal routing patterns and good adhesion of the materials, since these patterns are defined in polysilicon on which barrier and seed layers are deposited selectively, and no etch of seed layer or barrier is required before or after the final metallization is provided. The electroless plating is performed in open via holes i.e. holes extending through the entire substrate, which makes it easy to provide the necessary agitation of plating solutions.

Alternatively the invention provides for electroplating of the metallization, using the poly-silicon as conduction layer, suitably protected by oxide to leave only desired areas exposed to plating.

In a first aspect the invention provides a method of making a substrate-through metal via having a high aspect ratio, in a semiconductor substrate, and a metal pattern on the substrate surface, comprising:
  a) a semiconductor substrate (wafer);
  b) poly-silicon on the substrate;
  c) the poly-silicon on the substrate surface;
  d) selectively depositing Ni on the patterned poly-silicon by an electroless process, and
  e) providing a barrier layer of silicide $Si_xNi_y$;
  making a via hole through the substrate, wherein the walls in the hole is subjected to the same processing as in steps b)-d);
  depositing Cu on the Ni by a plating process.

In another aspect there is provided a method of making a substrate-through metal via having a high aspect ratio, in a semiconductor substrate, the substrate having a metal pattern on its surface, comprising:
  providing a semiconductor substrate (wafer);
  making a via hole through the substrate;
  oxidizing the substrate including the walls in the hole;
  depositing poly-silicon on the wafer;
  patterning the poly-silicon on the substrate surface by etching away unwanted portions;
  selectively depositing Ni on the poly-silicon by an electroless process, and heating the deposited Ni to about 300-700° C. to create an intermediate layer of silicide $Si_xNi_y$;
  depositing Cu on the Ni by an electroless process.

In a further aspect the invention provides a method of making a substrate-through metal via having a high aspect ratio, in a semiconductor substrate, the substrate having a metal pattern on its surface, comprising:
  providing a semiconductor substrate;
  oxidizing the substrate;
  depositing poly-silicon on the substrate;
  patterning the poly-silicon on the non-structured substrate surface by etching away unwanted portions;
  making a via hole through the substrate;
  providing an oxide layer on the walls in the hole;

depositing a first SiN layer on the oxide;
providing a second poly-silicon layer on the oxide layer in the hole, thereby providing a gap between the poly-silicon on the walls of the via hole and the first deposited poly-silicon;
depositing a further SiN layer on the poly-silicon, the further SiN layer being thinner than the first SiN layer; and
plating Ni selectively on the poly-silicon surfaces, whereby the Ni deposited on the two different poly-silicon surfaces eventually will bridge the gap and form a continuous layer of the deposited Ni.

In a still further aspect the invention provides a method of making a substrate—through metal via having a high aspect ratio, in a semiconductor substrate, the substrate having a metal pattern on its surface, comprising:
providing a semiconductor substrate;
oxidizing the substrate;
depositing poly-silicon on the substrate;
making a via hole through the substrate;
providing an oxide layer on the walls in the hole;
patterning the poly-silicon on the non-structured substrate surface by covering selected portions with an insulating material, e.g. oxide to define routing;
providing a poly-silicon layer on the oxide layer in the hole;
depositing Ni selectively by electroless plating on the poly-silicon surfaces, whereby the Ni deposited on the two different poly-silicon surfaces eventually will bridge the gap and form a continuous layer of the deposited Ni;
plating Cu to fill the hole and cover the exposed polysilicon areas to form routing.

The invention also provides a semiconductor device comprising a substrate wafer of silicon, through-wafer vias, lateral redistribution/routing structures on the wafer surface, an oxide layer on the substrate, and further comprising a continuous Cu layer covering the lateral redistribution/routing structures and the surfaces in the via hole, made by the process according to claim 21, wherein the line width of the routing structures is to <10 µm, preferably <5 µm, more referred in the sub µm range.

The invention furthermore provides a semiconductor device comprising a substrate wafer of silicon, through-wafer vias, lateral redistribution/routing structures on the wafer surface, an oxide layer on the substrate, and further comprising a continuous Cu layer covering the lateral redistribution/routing structures and the surfaces in the via hole.

Preferred embodiments are defined in dependent claims.

A major advantage with the present invention is that it enables batch processing of wafers as opposed to prior art methods where individual wafers are processed one by one, which renders the process very cost effective through simultaneous double sided processing. Open vias improves the wetting capability during plating, overcoming drawbacks with prior art methods. It also enables manufacture of rigid TSV wafers having hermetically sealed via structures.

Further scope of applicability of the present invention will become apparent from the detailed description given hereinafter and the accompanying drawings which are given by way of illustration only, and thus not to be considered limiting on the present invention, and wherein

BRIEF DESCRIPTION OF THE DRAWINGS

FIGS. 1-7 illustrate a process sequence of one embodiment of a method;

FIGS. 8-14a illustrate a process sequence of another embodiment of a method;
FIG. 14b is a top view of the structure in FIG. 14a;
FIG. 15 shows schematically electroplating of a structure from FIG. 14a;
and
FIG. 16a-b illustrate the invention using different via types.

DETAILED DESCRIPTION OF PREFERRED EMBODIMENTS

Figure 1:
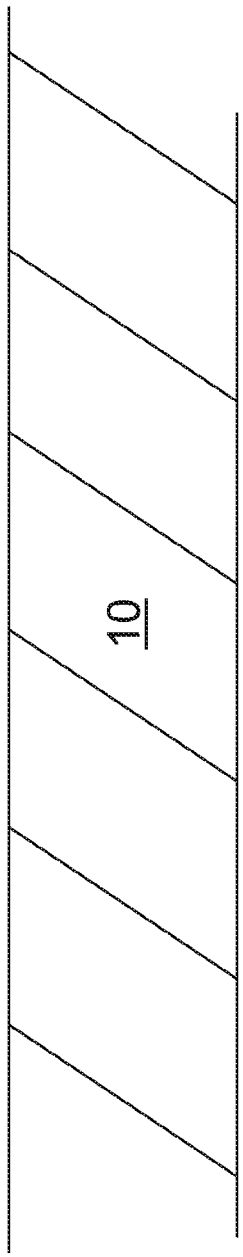

The present invention provides a method of providing a conformal metal coating in high aspect ratio vias. This is achieved by using an electroless deposition of copper on a base of n-type doped (e.g. Phosphorous) poly-silicon, optionally with a Ni barrier layer also provided by electroless deposition. Additionally, in the same deposition step, self-aligned routing is provided.

The term "electroless plating" as used herein is equivalent to "chemical plating".

The method will now be described with reference to the drawing figures.

Thus, as shown in FIG. 1, a substrate 10, preferably a wafer of a semiconductor material, suitably single crystalline silicon, is provided, although other materials common in MEMS/IC processing is usable.

Figure 2:
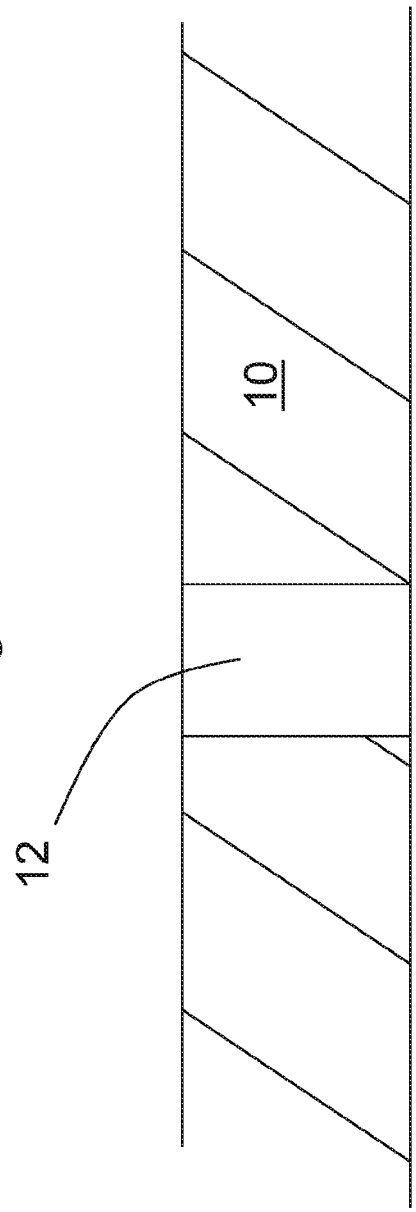

Referring to FIG. 2, a through-hole 12 is made in the substrate by commonly known processes, e.g. by lithography involving providing a resist on the surface, exposing a pattern corresponding to the hole(s) to be made, and developing the resist (not shown). Then an etch is applied whereby a hole 12 is made.

The entire substrate is passivated, preferably by oxidation, as shown in FIG. 3, such that the surfaces 14, 16 of the substrate and also the walls 18 in the hole 12 are covered with a thin oxide layer 20. The thickness of the oxide is >0.5 µm, typically about 1 µm.

Then, poly-silicon is deposited over the substrate to form a poly-silicon layer 22 covering the entire substrate including the walls in the hole 12, as can be seen in FIG. 4. A conformal deposition technique such as LPCVD (Low Pressure Chemical Vapour Deposition) is preferred due to its good uniform coverage on the high aspect ration via holes.

Optionally the poly-silicon is doped, preferably with phosphorous, either in the deposition process or subsequently by a dopant diffusion or ion implanting process with subsequent anneal/activation.

Now the poly-silicon is patterned using similar or the same techniques as previously, i.e. lithography for providing an etch mask so as to enable etching away undesired portions of the poly-silicon to leave only areas 24 of the poly-silicon 22 suitable for plating, FIG. 5. These areas can be routing patterns or other structure on the surface.

Now a seed layer for later plating is to be provided on the poly-silicon areas that remain, suitably by an electroless deposition of Cu. However, a barrier layer 26 against Cu diffusion is required and such a barrier is therefore first applied by electroless deposition of Ni or Ni alloy, that selectively will coat the poly-silicon, see FIG. 6. Cu is subsequently deposited by electroless plating on the Ni.

In order to improve adhesion of the Ni layer suitably a high temperature silicidation is performed, e.g. by an RTA process (Rapid Thermal Annealing), suitably at 300-700° C. This will form a thin intermediate layer of silicide, $Si_xNi_y$ wherein x:y can vary in the range 1:2 to 2:1 (the exact composition depends on temperature), which is known for good and stable electrical properties and is frequently used in e.g. IC processes as diffusion barrier. This silicide layer is shown as 27 in FIG. 7 as a thicker interface layer.

Many other TSV processes include starting substrates with metal which makes them more limited in terms of what processes and temperatures can be used.

If hermetically sealed vias are needed a thicker copper layer 28 is plated on the barrier/seed layer 27 by an electroless process whereby the hole is optionally eventually closed and a solid metal via formed in the same process step as the desired routings or other structures defined on the surface of the substrate, see FIG. 7.

It should be noted that this embodiment entails processing on wafers exhibiting topography (i.e. holes) which renders it slightly more complicated, although it still results in advantageous features compared to the prior art.

In another embodiment, which is till more advantageous in that it eliminates the need for lithography on non-flat surfaces, the process sequence is slightly altered, reference is made to FIGS. 8-14. This embodiment allows smaller feature sizes in the routing structures. In particular it is possible to achieve line widths, i.e. Cu RDLs, as narrow as down to <10 µm<5 µm even sub µm, which is 10-25 times smaller than prior art methods achieve. The reason is that in prior art methods the wafers are patterned after the holes are made, which renders the process more difficult. Also the spacing between lines can be made very small, in the same range as the above mentioned line widths.

Figure 8:
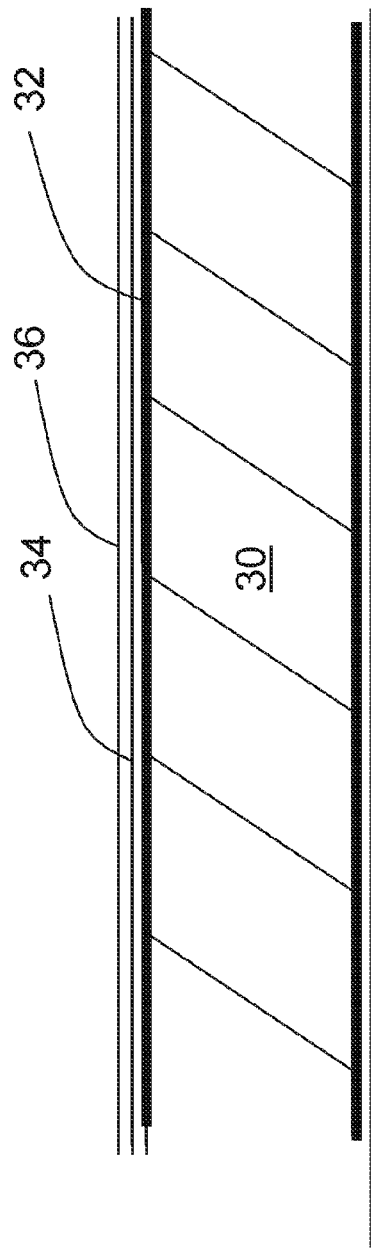

Namely, a substrate wafer 30 is provided as previously, but now the entire wafer is oxidized 32, the thickness of the oxide being >0.5 µm, typically about 1-3 µm. The oxide is covered with a protective SiN layer 34 which is comparatively thick (i.e. >0.1 µm thick). The SiN will protect the oxide in later process steps. Then a fairly thick (>2 µm thick) poly-silicon layer 36, is deposited over the entire wafer, as shown in FIG. 8.

Figure 9A:
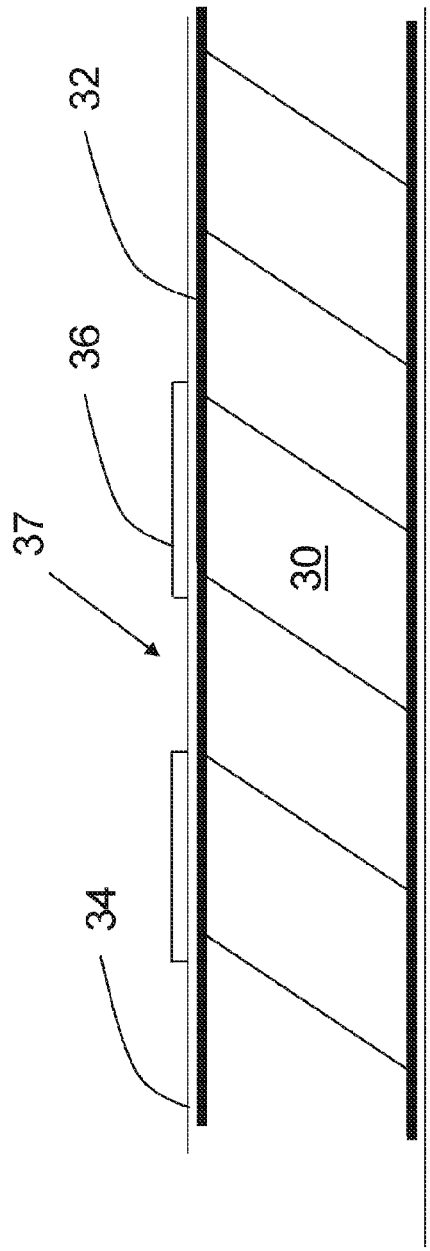

The poly-silicon 36 on the flat substrate, i.e. without topography (no holes) is patterned by lithography to provide a structure that corresponds to routings on the surface, if required, and also an opening 37 is provided for etching the through-hole, see FIGS. 9a-b (the hole to be made is shown in broken lines in FIG. 9b). By virtue of the processing being performed on a flat substrate it is possible to reach resolution of the fine features down to the sub-µm range. Then a further SiN layer 38 is applied, this layer being thinner than the protective SiN layer 34 applied previously, for reasons that will be apparent below.

After suitable masking, e.g. spinning a resist and using photolithography to remove unwanted areas, an etch is applied to the wafer through the mask whereby a hole 39 is etched through the wafer, FIG. 10a.

A localized thermal oxidation is performed whereby only the exposed silicon surfaces are oxidized, i.e. the walls of the through-hole are coated with oxide 40, FIG. 10b, the thickness of the oxide being >0.5 µm, typically about 1-3 µm, while the surface areas protected with SiN will not become oxidized.

Now an etch is applied which will remove the SiN 38 on the horizontal surfaces leaving the first SiN layer 34 and the poly-silicon 36 exposed, as shown in FIG. 11. However, in order to be able to provide a good seed-layer that ascertains the final coating with metal both to fill the hole and to provide the copper on the routing structures, and most importantly provides electrical connection between via and routings, poly-silicon must be provided on the walls of the hole, and therefore poly-silicon 41 is deposited again over the entire wafer, as shown in FIG. 12. The poly-silicon layer 41 is typically thinner than the poly-silicon 36 provided earlier in the process. This deposition process will cover the wafer surface, either only one side or optionally both sides, with poly-silicon, and thus it must selectively be removed so as to expose only the poly-silicon 36 which defines the routing structures, otherwise the entire surface would subsequently be plated with metal.

To this end a high biased RIE is applied to the surface, which removes the second deposition of thinner poly-silicon down to the nitride/oxide layer except for the areas covered by the first thicker deposited poly-silicon 36, whereby the structure shown in FIG. 13a is arrived at. The etching process is set up to only etch the second poly-silicon layer on the field surfaces, but does not attack the second, vertically provided poly-silicon on the via walls.

Figure 13C:
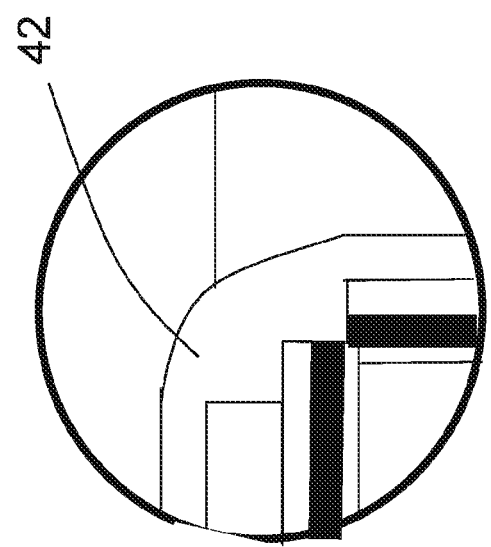
Figure 13B:
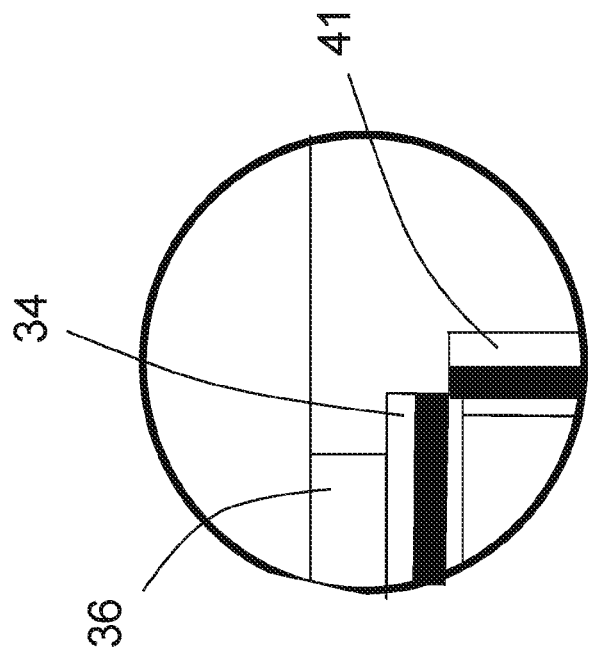

A very important feature is what is shown in the encircled portion, magnified in FIG. 13b, namely, that despite the presence of a "break" in the continuity of the poly-silicon layers 34, 41, it will be possible to provide a continuous Ni layer 42 by electroless plating which is made selectively on the poly-silicon surfaces. In contrast to electro-plating the electroless plating will cause the Ni to grow such that the Ni deposited on the two different poly-silicon surfaces eventually will "bridge" the gap and form a continuous layer of the deposited Ni. The Ni layer is shown in FIG. 13c. Preferably the Ni layer is provided as a Cu diffusion barrier on which subsequently a copper can be plated so as to fill the hole and provide copper routings on the wafer surface. The Ni is shown as layer 42 in FIG. 14a, and the plated Cu is shown as 43. It is an important feature of the invention that the plated Cu 43 is continuous, i.e. there is no distinct interface between the horizontally applied Cu and the Cu inside the via, see also FIG. 14c, where the Cu layer is continuous and extends on both sides. Again, silicidation to form $Si_xNi_y$, as disclosed previously, could be performed for improved adhesion.

Figure 14B:
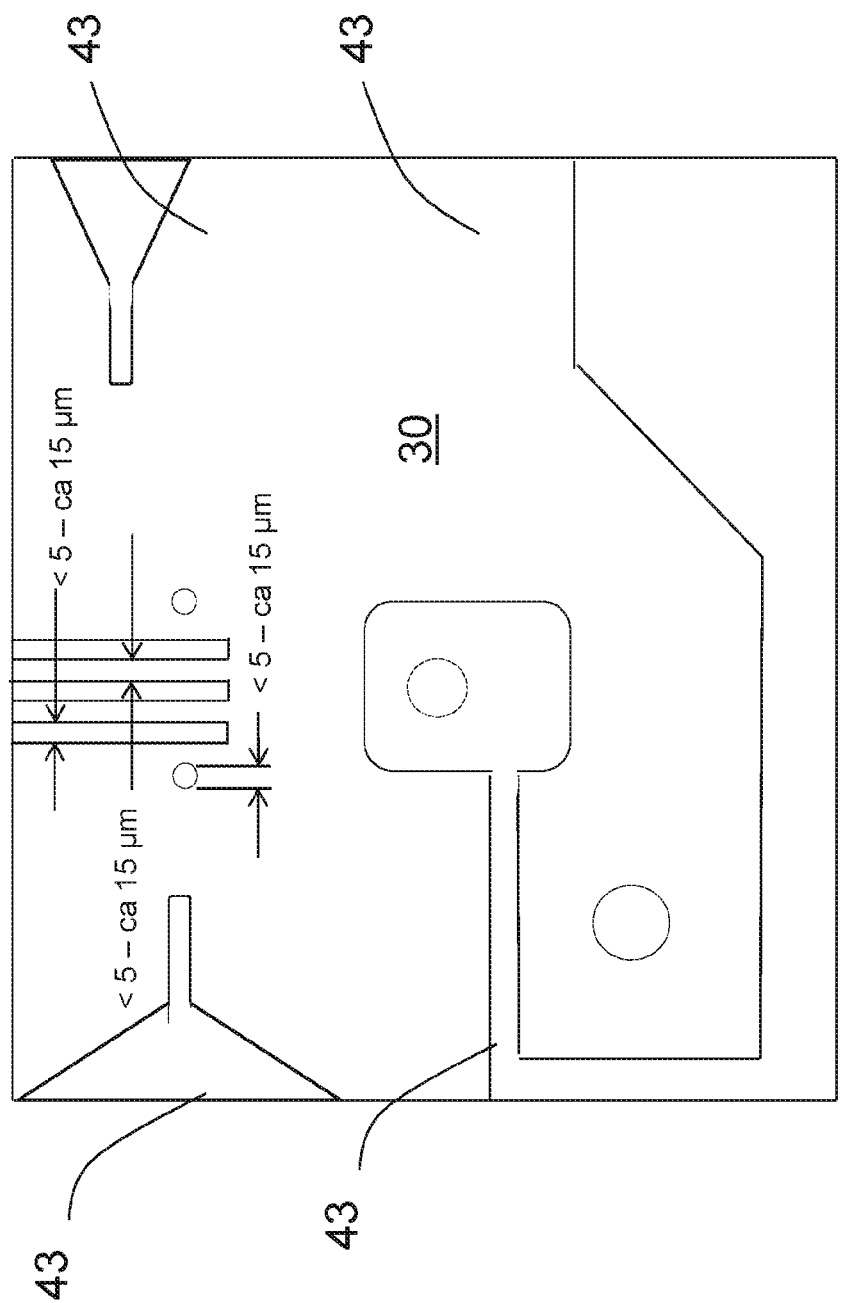

FIG. 14b shows the structure of FIG. 14a from above, i.e. a substrate 30 wherein the routing structure 43 is shown, and obtainable dimensions are indicated.

The preferred electroless Ni plating is commercially available and is phosphorous based, and therefore, in order to obtain the best results, the poly-Si is preferably doped with phosphorous. The poly-Si can either be in situ doped or it can be doped in a separate doping process involving annealing.

In the embodiments shown and described, only the upper (as seen in the figures) side of the substrate is processed to provide routing. However, of course both sides of the substrate can be processed to provide routing, and this aspect is also within the inventive concept.

Figure 14C:
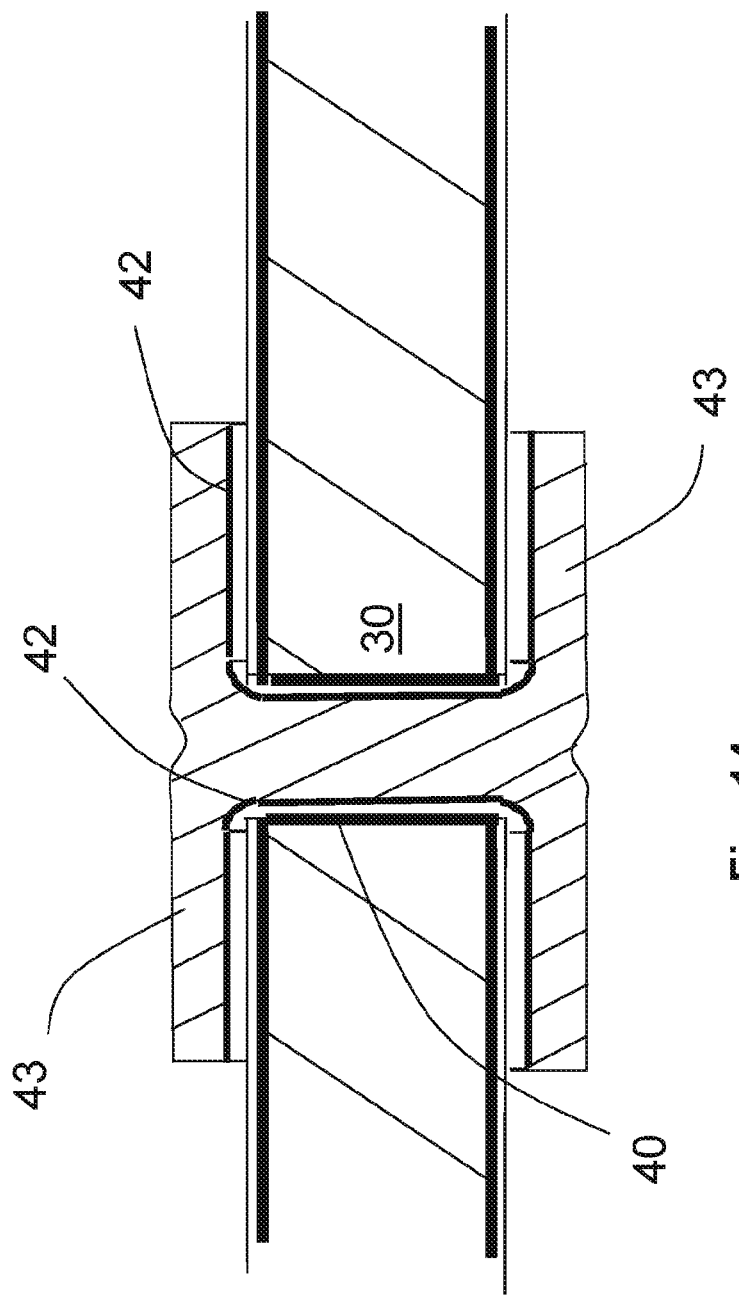
FIG. 14c illustrates the provision of continuous Cu forming routings on both sides and a via.

An example of "double-sided" processing giving routing on both sides is shown in FIG. 14c.

Sometimes it is desirable to provide 100% hermetically tight vias, i.e. there must not be any leakage between the opposite sides of the substrate wafer through the vias.

In the methods described above, inevitably there is a risk that bubbles are formed during the electroless plating and this formation of bubbles can cause a problem in that there can be a void formed in the center of the via, which in a worst case scenario could give rise to a channel providing non-hermetic sealing between opposite sides of the substrate wafer. This is schematically illustrated with broken lines in FIG. 15.

Figure 15:
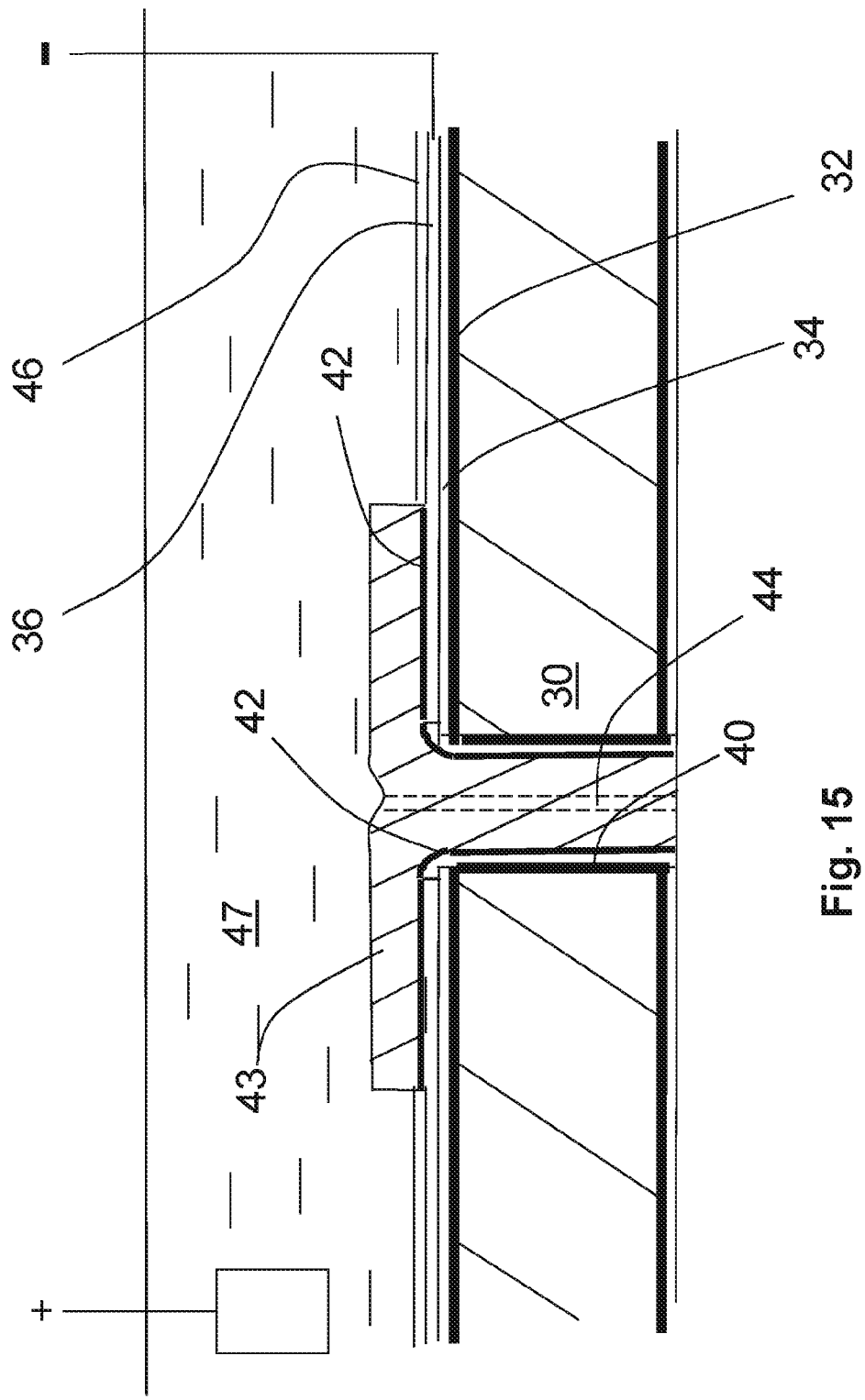

In order to prevent this to happen and to ascertain 100% hermeticity, the methods disclosed herein, in a further embodiment, can be supplemented with an additional electroplating step, that does not generate bubbles and is used for conventional TSV from Cu, and which will be described in detail below with reference to FIG. 15.

In order to be able to apply the required potentials to the areas pre-plated by electroless plating, one has to provide electrical communication between the areas to be plated.

Thus, the poly-silicon 36 deposited in a previous step is not patterned and etched to define routings, as described in connection with e.g. FIG. 9a, instead the poly-silicon 36 is covered selectively with an insulating material 46, e.g. oxide, according to a desired pattern to define the routing pattern, and will thus cover only the portions not defining the routing. In this manner the oxide 46 protects the poly-silicon from being plated (electroless Ni and Cu seed layers), and only the desired routing pattern and via structures will be coated with metal. Thus, the poly-silicon layer will act as the means to transport current to each location where electroplating is desired. The entire wafer is immersed in a plating bath 47 and a negative potential (DC) is applied to the polysilicon, most often along the wafer edge, so as to provide for reduction of metal onto the locations where the plating is to occur.

In addition to DC plating different types of so called pulse plating can be used. One risk with DC plating is that the via holes can be sealed only at the opening with a potential void being formed inside the via. With (reversed) pulse plating this phenomenon can be reduced and even eliminated.

Particularly advantageous is if the via structure is of the type disclosed in EP 2 165 362 (ÅSTC Aerospace AB), referred to as XiVia™. This via structure comprises a wide part and a narrow part with sloping surfaces. The narrow part is about 25 μm of the wafer thickness. There is furthermore a "stricture" S in the via with smaller diameter (in the order of <10 μm), which makes it easier and faster to seal and obtain a hermetic closure. The difference between an ordinary via and the XiVia™ type of via is schematically illustrated in FIG. 16 (dimensions not to scale). Thus, in FIG. 16a it is clearly seen that there is fairly large area (inner circumferential surface; width/diameter 50-75 μm, hole length/depth 300-400 μm) that has to be plated and it will necessarily take a substantial time to close the via, which is one problem in itself, since processing time is costly. Another problem is that the plating rate is somewhat faster at the edges E indicated with an arrow from inside the via, and as a result the via is closed at the "entrances" and hence there is a risk that a void can be the result. Such void V is schematically illustrated with the broken lines in FIG. 16a. In use and/or processing this void which contains residual materials from the plating (liquid, gas) can cause cracking of the wafer material, and hermeticity will thereby be lost.

In contrast, the via (XiVia™) shown in FIG. 16b will close only at the stricture S and thus no void is formed and the hermeticity is guaranteed.

Thus, it should be emphazised that in the embodiment wherein the via comprises a narrow and a wide path it is very easy to obtain a continuous plated Cu layer, the will close (at least) the narrow part of the via and in the process provide a hermetically sealed structure with no joints.

The invention claimed is:

1. A method of making a substrate-through metal via having a high aspect ratio, in a semiconductor substrate, and a metal pattern on the substrate surface, comprising:
    a) providing a semiconductor substrate (wafer);
    b) depositing poly-silicon on the substrate;
    c) patterning the poly-silicon on the substrate surface;
    d) selectively depositing Ni on the patterned poly-silicon by an electroless process, and
    e) providing an intermediate barrier layer of silicide $Si_xNi_y$ by silicidation of the deposited Ni through annealing;
    making a via hole through the substrate, wherein the walls in the hole is subjected to the same processing as in steps b)-d);
    depositing Cu on the Ni by a plating process.

2. The method according to claim 1, wherein the barrier layer of silicide $Si_xNi_y$ is provided by heating the deposited Ni to about 300-700° C.

3. The method according to claim 1, wherein the patterning of the poly-silicon is achieved by etching away unwanted portions or by covering with insulating material.

4. The method according to claim 1, wherein the Cu plating comprises electroless plating, and optionally a subsequent electroplating.

5. The method according to claim 1, wherein x:y is in the range 1:2 to 2:1.

6. The method according to claim 1, wherein the deposition of Cu is continued until the via hole is closed.

7. The method according to claim 1, further comprising oxidizing the substrate before depositing poly-silicon.

8. The method according to claim 7, wherein the hole is made before the step of oxidizing the substrate.

9. The method according to claim 8, further comprising covering the resulting oxide with a protective first layer of SiN.

10. The method according to claim 8, further comprising providing a second poly-silicon layer on the oxide layer in the hole, thereby providing a gap between the poly-silicon on walls of the via hole and the first deposited poly-silicon.

11. The method according to claim 7, wherein the hole is made after the step of patterning the poly-silicon.

12. The method according to claim 1, comprising depositing a further SiN layer on the poly-silicon, the further SiN layer being thinner than a first SiN layer.

13. The method according to claim 12, further comprising providing a mask on the further SiN layer to define the via hole, and etching through said mask to make the via hole.

14. The method according to claim 13, further comprising oxidizing the walls in the via hole.

15. The method according to claim 12, further comprising
    removing the further SiN layer from the substrate, to expose poly-silicon, and
    depositing further poly-silicon over the entire substrate including inside the via holes, the further poly-silicon being thinner than the poly-silicon provided earlier, and
    subsequently applying an etch to remove the second deposition of thinner poly-silicon on the field surfaces, but not the vertically provided poly-silicon on the via walls, thereby providing a gap between the poly-silicon on the walls of the via hole and the first thicker deposited poly-silicon, and wherein
    the Ni deposited by electroless plating on the two different poly-silicon surfaces eventually will bridge the gap and form a continuous layer of the deposited Ni.

16. The method according to claim 15, further comprising applying a seed layer, and selectively plating Cu on said seed layer.

17. The method according to claim 15, further comprising providing a Cu diffusion barrier before applying the seed layer.

18. The method according to claim 17, wherein the diffusion barrier layer is Ni based.

19. The method according to claim 18, wherein the diffusion barrier layer comprises phosphorous doped Ni.

20. A method of making a substrate-through metal via having a high aspect ratio, in a semiconductor substrate, the substrate having a metal pattern on its surface, comprising:
- providing a semiconductor substrate (wafer);
- making a via hole through the substrate;
- oxidizing the substrate including the walls in the hole;
- depositing poly-silicon on the substrate;
- patterning the poly-silicon on the substrate surface by etching away unwanted portions;
- selectively depositing Ni on the poly-silicon by an electroless process, and heating the deposited Ni to about 300-700° C. to create an intermediate layer of silicide $Si_xN_y$;
- depositing Cu on the Ni by an electroless process.

* * * * *